United States Patent
Stone (10) Patent No.: US 6,867,611 B2
(45) Date of Patent: *Mar. 15, 2005

(54) TEMPERATURE-CONTROLLED THERMAL PLATFORM FOR AUTOMATED TESTING

(75) Inventor: William M. Stone, Lenox, MA (US)

(73) Assignee: Temptronic Corporation, Sharon, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 10/802,961

(22) Filed: Mar. 16, 2004

(65) Prior Publication Data

US 2004/0174181 A1 Sep. 9, 2004

Related U.S. Application Data

(63) Continuation of application No. 09/908,149, filed on Jul. 18, 2001, now Pat. No. 6,744,270.
(60) Provisional application No. 60/267,830, filed on Feb. 9, 2001, and provisional application No. 60/220,016, filed on Jul. 21, 2000.

(51) Int. Cl.[7] .......................... G01R 31/02; F25B 29/00
(52) U.S. Cl. ...................................... 324/760; 165/253
(58) Field of Search .............................. 324/760, 765, 324/158.1; 165/201, 253, 260, 80.2; 62/50.1, 50.7, 51.2; 359/392–395

(56) References Cited

U.S. PATENT DOCUMENTS

| | | | | |
|---|---|---|---|---|
| 4,734,872 A | | 3/1988 | Eager et al. ................ 364/557 |
| 4,848,090 A | | 7/1989 | Peters ........................ 62/3.3 |
| 4,951,602 A | | 8/1990 | Kanai ........................ 118/719 |
| 5,198,752 A | | 3/1993 | Miyata et al. ............... 324/158 |
| 5,205,132 A | | 4/1993 | Fu ............................. 62/208 |
| 5,278,495 A | | 1/1994 | Beaton et al. .............. 324/158 |
| 5,451,884 A | * | 9/1995 | Sauerland ................... 324/760 |
| 5,778,968 A | | 7/1998 | Hendrickson et al. ...... 165/80.1 |
| 5,847,927 A | * | 12/1998 | Minning et al. ............ 361/696 |
| 5,977,785 A | * | 11/1999 | Burward-Hoy ............. 324/760 |
| 5,983,711 A | | 11/1999 | Pappas et al. .................. 73/76 |
| 6,070,413 A | | 6/2000 | Ward .......................... 62/50.7 |
| 6,399,926 B2 | | 6/2002 | Takano et al. ............... 219/497 |
| 6,415,858 B1 | | 7/2002 | Getchel et al. .............. 165/206 |
| 6,445,202 B1 | * | 9/2002 | Cowan et al. ............... 324/760 |
| 6,489,793 B2 | * | 12/2002 | Jones et al. .................. 324/760 |
| 6,512,391 B2 | * | 1/2003 | Cowan et al. ............... 324/760 |
| 6,518,782 B1 | * | 2/2003 | Turner ........................ 324/760 |
| 6,545,494 B1 | * | 4/2003 | Olsen et al. ................ 324/760 |
| 6,549,026 B1 | * | 4/2003 | DiBattista et al. .......... 324/760 |
| 6,552,561 B2 | * | 4/2003 | Olsen et al. ................ 324/760 |
| 6,744,270 B2 | * | 6/2004 | Stone ......................... 324/760 |

FOREIGN PATENT DOCUMENTS

| | | | | |
|---|---|---|---|---|
| DE | 234748 A1 | 4/1986 | ......... H01L/21/205 |
| JP | 59150434 | 8/1984 | ........... H01L/21/60 |
| JP | 62193141 | 8/1987 | ........... H01L/21/68 |
| JP | 08153660 | 6/1996 | ......... H01L/21/027 |

* cited by examiner

*Primary Examiner*—David Zarneke
*Assistant Examiner*—Jermele Hollington
(74) *Attorney, Agent, or Firm*—Mills & Onello, LLP (57) ABSTRACT

A temperature-controlled system and method for supporting a wafer or packaged integrated circuit (IC) under test are described. The system includes a thermal platform having a top surface assembly on which the wafer or IC can be mounted. A thermal plate is located under and in thermal communication with the top surface assembly. The thermal plate is made of a porous thermally conductive material. A temperature-controlled fluid such as air enters and propagates radially through the porous material of the thermal plate. The temperature of the wafer or IC is controlled by controlling the temperature of the air passing through the thermal plate. The plate can be made of a sintered metal such as copper or a reticulated foam or a carbon or graphite foam.

22 Claims, 8 Drawing Sheets

TEMPERATURE-CONTROLLED THERMAL PLATFORM FOR AUTOMATED TESTING

RELATED APPLICATIONS

This application is a continuation of U.S. patent application Ser. No. 09/908,149, filed on Jul. 18, 2001, now U.S. Pat. No. 6,744,270, which is based on U.S. Provisional Patent Application Nos. 60/220,016 filed on Jul. 21, 2000 and 60/267,830 filed on Feb. 9, 2001. The contents of all of the prior applications are incorporated herein in their entirety by reference.

BACKGROUND OF THE INVENTION

In fabrication of integrated circuits (ICs), it is important to test the individual circuit chip die while they are still attached in a semiconductor wafer and to test the packaged integrated circuit devices. In many testing applications, the tests must be performed over temperature. Accordingly, automated test systems are commonly outfitted with temperature control systems which can control the temperature of the wafer or device under test.

In some testing systems, such as wafer probers, the wafer is held on a temperature-controlled chuck, and electrical stimulus signals are applied to the circuits on the wafer, circuit response signals are detected via an array of electrical contact probes brought into contact with the wafer. The temperature of the chuck and, therefore, the temperature of the wafer, can be controlled by a heater and/or heat sink integrated into the chuck and by temperature-controlled fluid circulated through the chuck. Such systems are manufactured and sold by Temptronic corporation of Sharon, Mass.

In other systems, packaged ICs are tested over temperature by applying the electrical stimulus signals and receiving response signals via the IC package pins. The device under test (DUT) is held in a socket on a platform, and the test signals are routed to the pins via the socket. In one such system, the THERMOSTREAM™ system manufactured and sold by Temptronic Corporation, a temperature-controlled steam of air is directed onto the DUT to control the temperature of the DUT during testing.

As wafers become larger, and as circuits become smaller and more densely integrated, positioning tolerances for these test systems become smaller. Accordingly, it is becoming increasingly important that the support system on which the DUT or wafer is supported be mechanically stable and rigid and also extremely flat, since mechanical flaws such as distortions in the platform would adversely affect the positioning capability of the system. This is particularly important in temperature-controlled test systems, since mechanical systems tend to distort and warp over temperature. Particularly at high temperature, distortions in the support platform can become so great that substantial inaccuracies in testing can result.

SUMMARY OF THE INVENTION

The present invention is directed to a mechanically stable temperature-controlled platform for supporting a workpiece such as a wafer or a packaged IC DUT during testing which eliminates these drawbacks. In accordance with the invention, there is provided a thermal platform and method for supporting a workpiece. The platform includes a top surface assembly on which the workpiece can be mounted. A thermal plate made of a porous thermally conductive material is located in thermal communication with the top surface assembly. A fluid inlet allows a temperature-controlled fluid, for example, air, to enter the thermal plate and propagate through the porous material of the thermal plate. A temperature controller controls the temperature of the fluid to control the temperature of the workpiece.

In one embodiment, the workpiece is a semiconductor wafer on which are formed one or more integrated circuits. In another embodiment, the workpiece is a packaged integrated circuit.

In one embodiment, the thermal platform is contained within a test system for testing the workpiece. For example, the test system can be a wafer prober machine or a packaged IC device handler. At least a portion of the temperature controller can be externally located such that it is connected to the test system via a hose. The temperature controller includes a fluid source for providing the temperature-controlled fluid to the test system via the hose. The one particular embodiment, the temperature controller includes a fluid heater located in the test system for heating the fluid.

In one embodiment, the porous thermally conducted material comprises a sintered metal. In another embodiment, the material comprises reticulated foam. The thermally conducted material can include copper. It can also comprise a carbon and/or graphite foam.

The thermal platform can include a layer of channels adjacent to the thermal plate which facilitate the flow of fluid through the thermal plate. The channels can be arranged in a radial spiral pattern to facilitate the flow of fluid radially from a central portion of the thermal plate to its perimeter. The channels can be formed in one or more surfaces of the thermal plate. Alternatively, the channels can be formed in a separate convector plate located adjacent to the thermal plate.

In another aspect, the invention is directed to an apparatus and method for testing an integrated circuit. The apparatus includes a test circuit in which the integrated circuit is supported. A temperature control is coupled to the test system. The temperature control system includes a fluid source for providing a fluid to the test system in thermal communication with the integrated circuit. A controller in the temperature control controls the temperature of the fluid to control the temperature of the integrated circuit. A fluid heater for heating the fluid is located within the test system.

In one embodiment of this aspect of the invention, the test system is a wafer prober. In another embodiment, the test system is a packaged integrated circuit device handler. Accordingly, the IC can be part of an IC wafer or it can be packaged in an IC package.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS OF THE INVENTION

Figure 1:
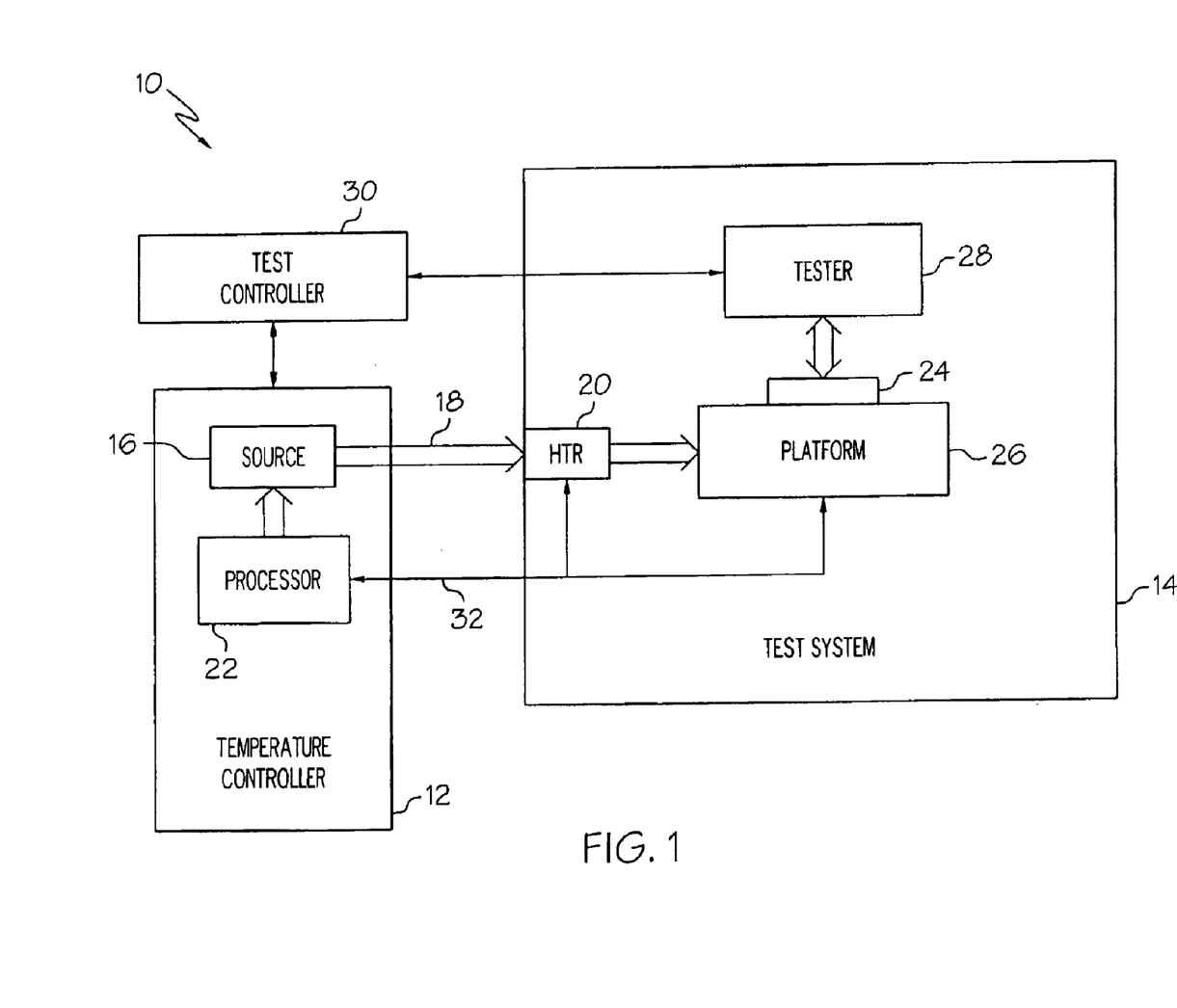
FIG. 1 is a schematic functional block diagram illustrating an automated test system in accordance with the present invention.

FIG. 1 is a schematic functional block diagram illustrating an automated test system 10 in accordance with the present invention. As shown in FIG. 1, the system 10 includes a temperature controller 12 which can be of the type manufactured and sold by Temptronic Corporation of Sharon, Mass. under the name THERMOSTREAM™. The temperature controller 12 includes an air source 16 which provides cold air along a gas hose 18 to the test system 14. The hose 18 can be a condensation-free hose of the type described in U.S. Pat. No. 6,070,413, issued on Jun. 6, 2000, assigned to Temptronic Corporation and incorporated herein by reference. The test system 14 can be a wafer prober or packaged device handler system for testing a workpiece 24, for example, wafers or packaged ICs, over temperature. A test controller 30 controls the application of stimulus signals to and detection and processing of response signals from the workpiece 24 via attester unit 28.

The temperature of the platform 26 and the workpiece 24 are controlled by the temperature controller 12. The temperature of the stream of air from the air source 16 is controlled to control the temperature of the workpiece 24. The stream of air enters the test system 14 at a heater 20, which heats the cool air as required to set the temperature of the workpiece 24 at the desired test temperature. Temperature sensors are provided both at the platform 26 and the workpiece 24. A temperature sensor can be provided as a temperature-sensitive circuit element integrally fabricated into the workpiece 24, in accordance with U.S. patent application Ser. No. 09/612,667, filed on Jul. 10, 2000, now U.S. Pat. No. 6,545,494, and U.S. patent application Ser. No. 09/839,274, filed on Apr. 20, 2001, now U.S. Pat. No. 6,552,561, both of which are assigned to Temptronic Corporation and are incorporated herein by reference.

The temperature controller 12 can use an auto-cascade refrigeration unit to provide the stream of cool air. This is a single compressor multiple refrigerant system which operates best under constant load. The unit is capable of producing supply air or gas temperatures as low as –85 degrees C. In another embodiment, the source could use a cascade refrigeration system, such as a two-stage cascade refrigeration system to achieve ultimate temperature lows. A unit with liquids being used as the control medium could also be used.

The temperature control approach can be implemented as a dual-loop temperature control of the type described in U.S. Pat. No. 4,734,872, issued on Mar. 29, 1988, assigned to Temptronic Corporation and incorporated herein by reference. Using the dual-loop control, the temperature of the workpiece and the air stream are monitored. The temperature of the workpiece is controlled by altering the temperature of the air stream to maintain the temperature of the workpiece at the desired temperature set point. To that end, temperature feedback signals indicating the temperature of both the workpiece 24 and the air stream are provided to the temperature control processor 22 via lines 32. Where it is desired to alter the temperature of the air stream, the heater 20 can be selectively activated to raise the temperature or deactivated to lower the temperature.

Figure 2:
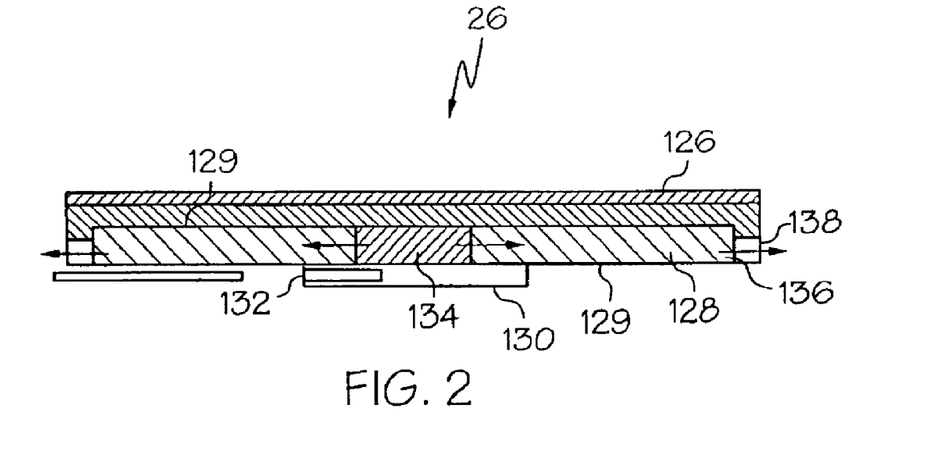
FIG. 2 contains a schematic cross-sectional view of one embodiment of the thermal platform of the invention.

In accordance with the invention, the platform 26 is configured to provide accurate, precise and uniform temperature control with very fast temperature transitions. FIG. 2 contains a schematic cross-sectional view of one embodiment of the thermal platform 26 of the invention. The platform 26 includes a top surface 126 on which the temperature-controlled workpiece 24 (not shown) can be supported during testing. The top surface 126 can be configured according to the testing application. For example, the top surface 126 can serve as a platen for electronic package test, a thermal platform for a wafer test, or a thermal platform for coating compact disks with ferrous coating.

Figure 3:
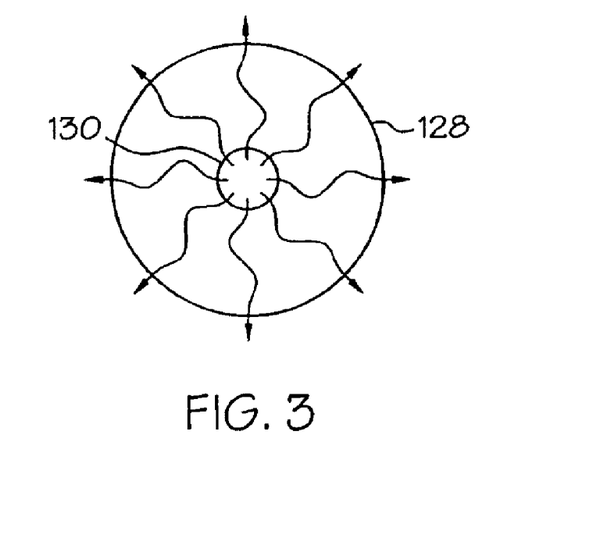
FIG. 3 contains a schematic pictorial view of the radial flow of the temperature-controlled fluid through the porous thermal plate of the invention.

The top surface assembly 126 is mounted over and in thermal communication with a thermal plate layer 128. The thermal plate 128 can be mechanically attached to the top surface assembly 126, such as by screws, pins, brazing, welding, etc. The thermal plate can also be adhered to the top surface assembly such as by a thermally conductive adhesive. The temperature of the thermal plate 128 is controlled to control the temperature of the top surface assembly 126 and the workpiece mounted thereon. In accordance with the invention, temperature is controlled by distributing temperature-controlled fluid, e.g., air, radially through the thermal plate 128. The thermal plate 128 is made of a porous thermally conductive material such as copper or carbon. The temperature-controlled fluid enters the thermal plate 128 through an inlet 132 and is conveyed to a central plenum 130. The fluid flows into the plate 128 at a centrally located aperture 134 in the plate 128. The fluid flows radially through the porous material of the plate 128 and exits the plate at the circumferential edge 136 of the plate 128. The fluid then exits the platform 26 via an outlet 138. FIG. 3 contains a schematic pictorial view of the radial flow of the temperature-controlled fluid through the porous thermal plate 128. Referring again to FIG. 2, the fluid is contained within the porous thermal plate 128 at its bottom surface by a layer of material 129. The material 129 can be a flame sprayed ceramic barrier layer or a high-temperature varnish. The material layer 129 prevents the fluid from escaping from the porous thermal plate 128 through its bottom surface.

The porous thermal plate 128 transfers the thermal energy from the circulating medium, e.g., air, to the top surface assembly 126 and, therefore, the workpiece, in a highly efficient manner. The thermal plate 128 is made of a porous thermally conductive material such as copper. The material can be sintered metal or reticulated foam. Alternatively, the material can be a high thermal conductivity carbon or graphite foam, such as that being developed by the Oak Ridge National Laboratory. The porosity of the material reduces its mass and also provides greatly increased surface area. Because of the reduced mass, much lower energy is required to transition temperature than would be required in a solid material of the same size. Also, the increased surface area of the porous material provides highly efficient heat transfer through the material. Also, the porous nature of the material creates a turbulent flow of the fluid through the medium, thereby blending the heating and cooling fluid medium and enhancing the uniformity of the temperature within the medium and on the workpiece. The uniformity of the porosity of the material of the thermal plate 128 allows for uniform fluid flow throughout the thermal medium, thereby establishing a uniform temperature distribution. Since the porous thermal medium is in thermal communication with the top surface assembly 126, it provides a highly uniform top surface temperature for the thermal platform. Also, the resulting reduction in thermal gradients on the surface enhances the flatness of the surface by reducing thermal expansion and contraction effects. Because of the mechanical heat transfer properties related to the thermal medium, the medium is also highly effective in heat sinking and absorbing thermal energy generated by power generating devices while they are under electrical test.

The surface of the thermal platform 26 and the porous thermal medium 128 can be made of common materials such as copper that have good thermal conductivity. Also, they have closely matched coefficients of expansion. With the distributed temperature uniformity and material similarities, there is little mechanical stress due to thermal growth to distort the surface and reduce its flatness. Because of the high degree of flatness, good contact is maintained between the wafer or device under test and the test equipment.

Figure 4:
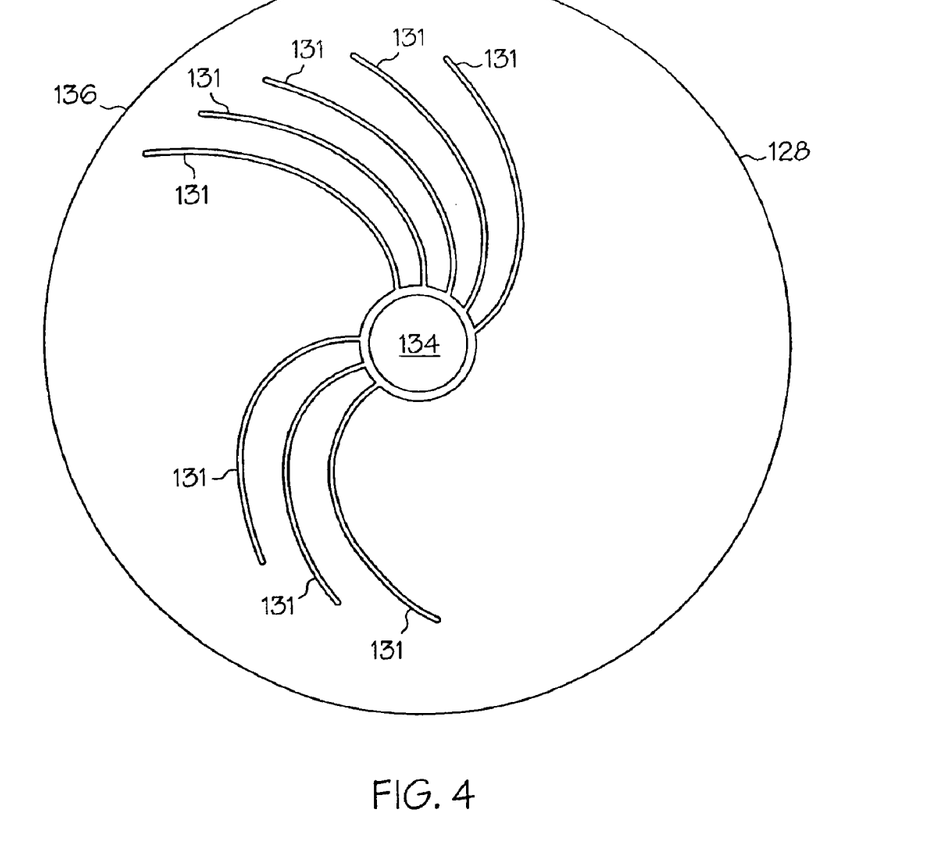
FIG. 4 is a schematic plan view of one embodiment of the thermal plate of the invention in which a spiral pattern of channels or grooves is formed to aid in distributing temperature-controlled fluid from a central aperture to the circumferential edge of the thermal plate, in accordance with the invention.

In one embodiment, even distribution of the temperature-controlled fluid is aided by a pattern of distribution grooves or channels formed in the thermal plate 128. FIG. 4 is a schematic plan view of one embodiment of the thermal plate 128 in which a spiral pattern of grooves 131 is formed to aid in distributing the fluid from the central aperture 134 to the circumferential edge 136 of the thermal plate 128. The grooves 131 can be etched, formed, machined or cast into the top and/or bottom surfaces of the thermal plate 128. The grooves 131 are shown in FIG. 4 as being distributed over only a portion of the surface of the thermal plate 128. However, it will be understood that any portion of the surface can include the distribution grooves. In one particular embodiment, the grooves 131 are distributed over the entire surface of the plate 128 in the spiral pattern illustrated in the figure.

Figure 5A:
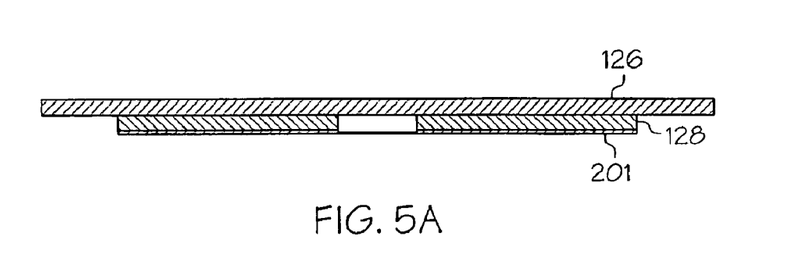
FIGS. 5A through 5C illustrate various embodiments of the thermal plate and top surface assemblies of the invention including one or more additional layers.
Figure 5B:
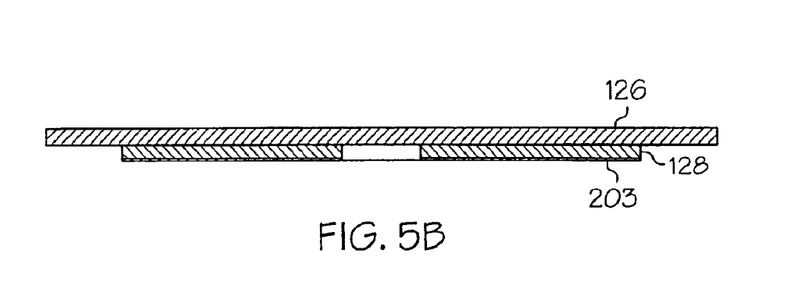
Figure 5C:
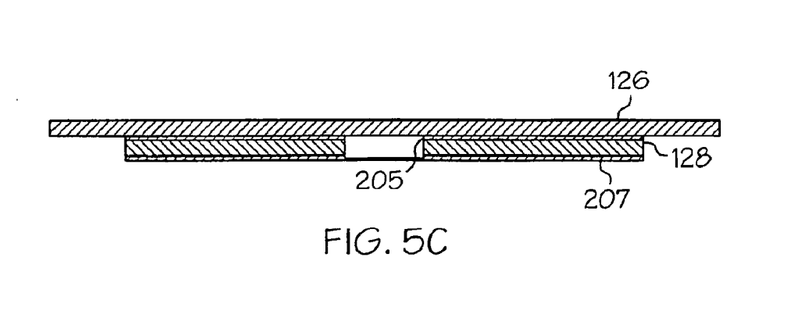

In another embodiment, the thermal plate 128 has additional layers attached to its top and/or its bottom surface. FIGS. 5A through 5C illustrate various embodiments of the thermal plate and top surface assemblies of the invention including one or more additional layers. In FIG. 5A, the porous thermal plate 128 is attached or adhered to the bottom of the top surface assembly 126. A bottom layer 201 of ceramic or high temperature varnish is attached to the bottom of the plate 128. In FIG. 5B, a layer of material 203 that is impervious to air is bonded to the lower surface of the thermal plate 128. In FIG. 5C, a three-layer sandwich structure is formed with layers 205, 207 of highly thermally conductive material bonded or attached to the top and bottom surfaces of the thermal plate 128. As in the other embodiments, the sandwich structure is bonded, adhered or fastened to the bottom of the top surface assembly 126 to be in intimate thermal contact with the assembly 126.

Figure 6:
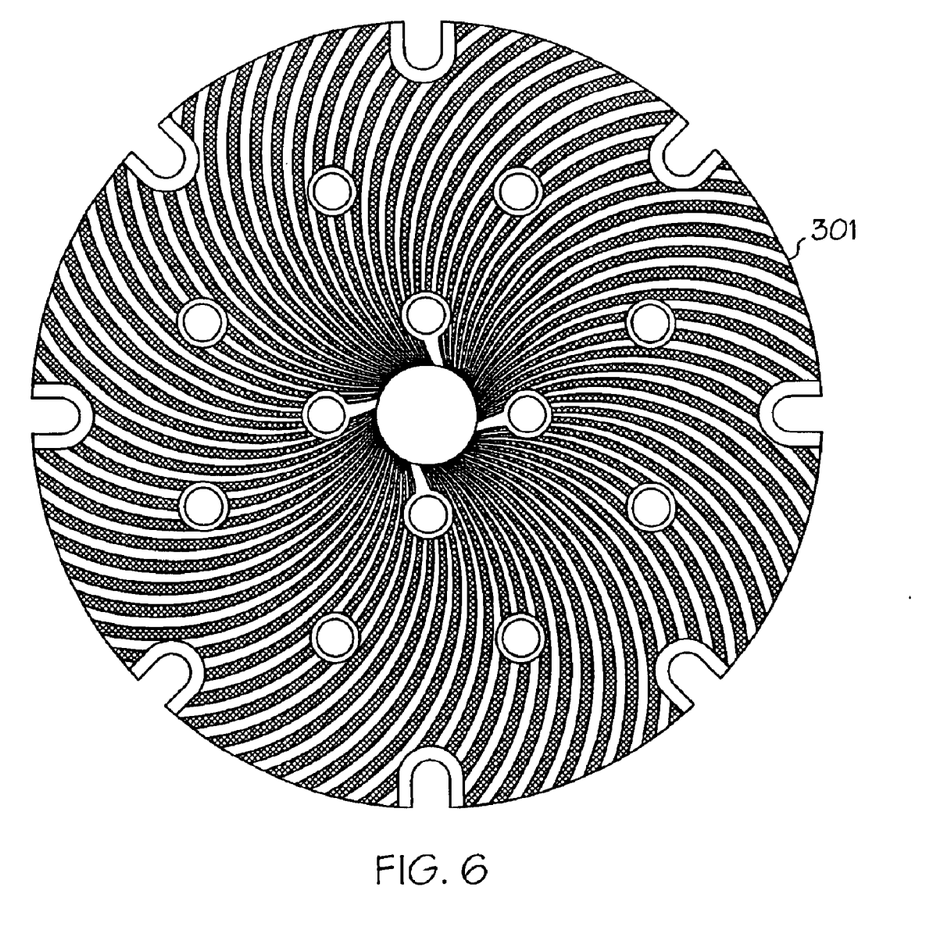
FIG. 6 is a schematic plan view of a surface of a convector plate in accordance with one embodiment of the invention.

The thermal plate 128 transfers the thermal energy from the fluid through the porous material to the top surface assembly 126 to which it is attached in a highly efficient manner. The surface assembly 126 of the platform 26 will in turn transfer the thermal energy into or out of a wafer or electronic package directly or indirectly through one or more layers of thermally conductive material. In one embodiment, one such layer is a convector plate disposed between the thermal plate 128 and the top surface assembly 126 or at the bottom of the thermal plate 128. FIG. 6 is a schematic plan view of a surface of a convector plate 301 in accordance with one embodiment of the invention. The convector plate 301 can be bonded or mechanically attached to the thermal plate 128 and is also used to seal the surface of the plate 128 to prevent the temperature-controlled fluid from escaping through the surface of the porous thermal plate 128. As shown in FIG. 6, each surface of the convector plate 301 can be formed with a pattern of channels used to facilitate the flow of fluid across the surface of the plate 301. In the particular plate 301 shown in FIG. 6, a pattern of spiral radial grooves is formed to assist in conducting the fluid from the central aperture to the perimeter of the device. Other patterns can also be used. For example, patterns of circular void regions can be formed in the surface(s) of the plate 301. The convector plate can be made of a highly thermally conductive material. The pattern of channels or grooves can be machined or photo etched into the surface of one or both sides of the plate 301.

In addition to, or instead of, the convector plate 301, other additional layers can also be disposed in proximity to the porous thermal plate 128. These additional layers can be maintained in contact with the thermal platform, mechanically or by vacuum. The additional layers can include features such as vacuum hold down patterns for wafers and/or electrical isolation layers such as polyamide and ceramics.

Figure 7:
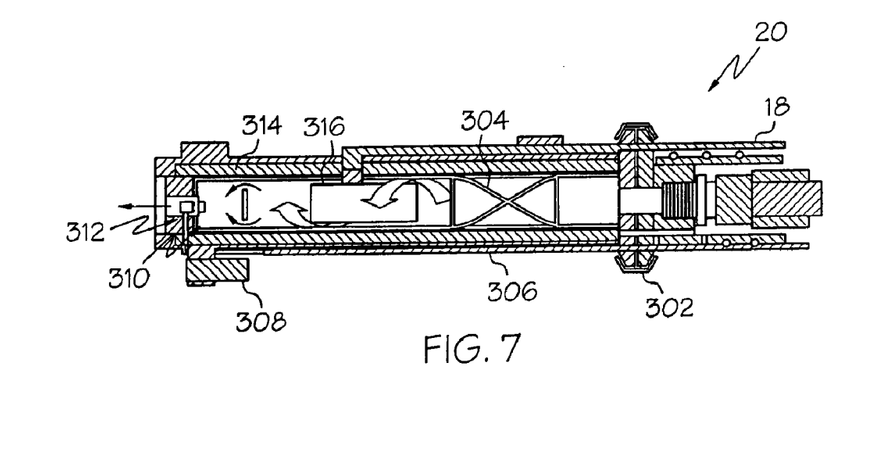
FIG. 7 is a schematic block diagram of one embodiment of an in-line fluid heater in accordance with the invention.

FIG. 7 is a schematic block diagram of one embodiment of an in-line heater 20 in accordance with the invention. As described in connection with FIG. 1, the heater 20 is used to heat the air from the air source 16 in the temperature controller 12. The hose 18 is connected to the heater 20 by a quick disconnect clamp 302. Cool air enters the heater 20 from the hose 18 and passes into a turbulence generator 304 which creates a turbulent flow in the air stream. The turbulent flow provides more uniform temperature distribution. Next, the air passes to the heater 316 which heats the air. Next, the heated air enters a mixing chamber 310, and the turbulent heated air exits the heater 20 and is conveyed to the inlet of the thermal platform 26 (FIG. 1).

The heater 20 is insulated from the system environment by insulation 314. An air temperature sensor arrangement 312 can be located near the heater outlet. Also, a platform temperature sensor 308 can be located on the heater 20. Alternatively, the platform temperature sensor can be located on the platform. The sensors 308 and 312 provide their respective temperature sense signals on sense lines 306.

The location of the heater 20, i.e., within the prober or handler, allows for maximum heat transfer to the thermal platform 26 and minimizes transition time. The greater the distance from the temperature source, the greater the mass that must be transitioned. By placing the heater in the prober or handler, there is less mass that must be transitioned, leading to lower transition times. That is, only the lines from the heater section 20 are required to transition from cold to hot. This technique minimizes the amount of mass to transition and maximizes the speed of transition. The heater section 20 is designed to mix the air and to maximize heater efficiency. It is also designed for ease of attachment to the cold air source and to provide air at a uniform temperature to the thermal platform.

Figure 8:
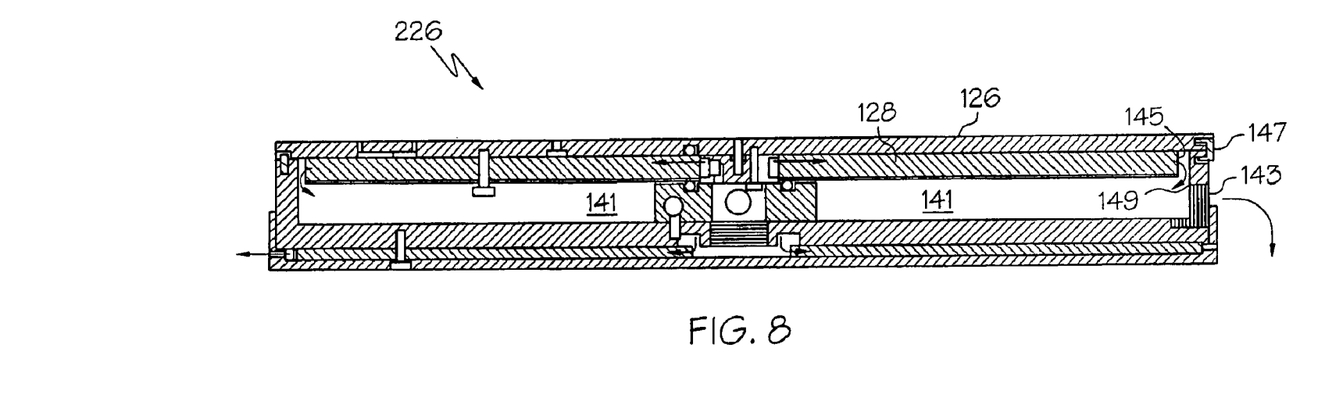
FIG. 8 is a schematic cross-sectional diagram of a thermal platform in which the temperature-controlled fluid circulated through the porous thermal plate is recovered, in accordance with the invention.

In one embodiment, the temperature-controlled fluid is captured as it escapes the porous perimeter of the thermal plate 128. FIG. 8 is a schematic cross-sectional diagram of a thermal platform 226 in which the temperature-controlled fluid circulated through the porous thermal plate 128 is recovered, in accordance with the invention. The thermal platform 226 of FIG. 8 includes a housing 149 which contains the fluid, i.e., air, as it exits the porous thermal plate 128 at its perimeter edge 145. The air passes into a chamber 141 and exits the chamber through an exhaust port 143 where it can be recycled or discarded. This recapture of the air prevents the overheating or overcooling of the test system, i.e., prober or handler, in which the platform 226 is used. Also, the recovery plenum avoids the impact of the air flow on the needles used for probing wafers, thereby reducing bounce of jitter of the needles. This results in more stable test results.

The embodiment of FIG. 8 also illustrates an approach to attaching the top surface assembly 126 to the thermal plate 128 which reduces distortion in the platform 226. Retaining clips 147, made of a spring metal, are used to hold the top surface 126 and the thermal plate 128 together. By attaching the two without the rigid constraint of such approaches as screws, rivets, etc., the two layers are allowed to expand and contract laterally relative to each other. This eliminates substantial distortion and warp effects due to the difference in thermal expansion coefficient of the two layers.

Figure 9:
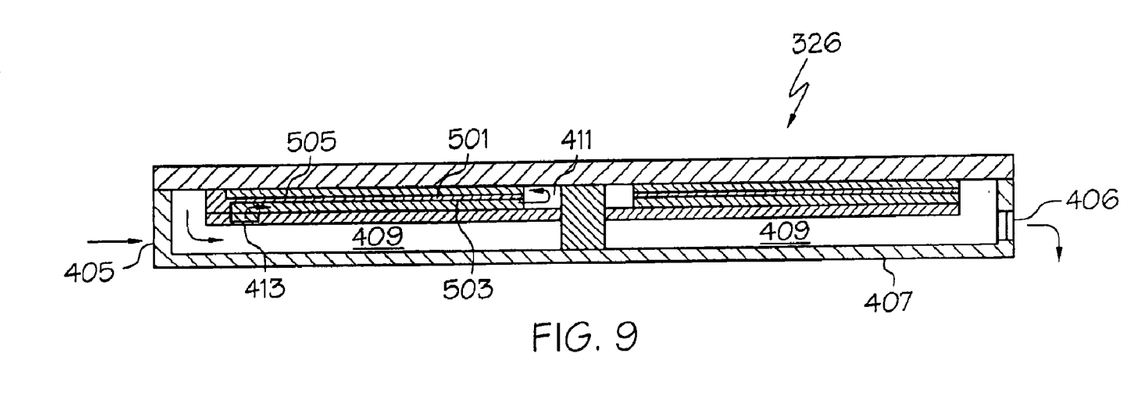
FIG. 9 contains a schematic cross-sectional diagram of another embodiment of the thermal platform of the invention in which the temperature-controlled fluid is circulated radially from the perimeter to the center of the thermal plate and from the center back out to the perimeter.

FIG. 9 contains a schematic cross-sectional diagram of another embodiment of the thermal platform 326 of the invention in which the temperature-controlled fluid is circulated radially from the perimeter to the center of the thermal plate and from the center back out to the perimeter. According to this embodiment, the air enters the platform 326 at an inlet 405 and passes through a chamber 409 enclosed by the housing 407. The air passes up through an opening 413 and is conveyed along the bottom surface 503 of a convector plate 501, described above in connection with FIG. 6. In this embodiment, the convector plate 501 has channels formed on both its top and bottom surfaces to assist in the flow of the fluid from the perimeter to the center along the bottom surface 503 and then from the center back out to the perimeter along the top surface 505. When the air reaches the cental aperture 411, it enters the region above the plate 501 and flows along the top surface 505 radially back out to the perimeter of the plate 501, using the channels formed in the surface to assist in the flow. The air then passes out of the platform 326 through an outlet 406 where it can be recovered or discarded.

In automated testing, there are applications in which electrical isolation is extremely important. There are also applications in which electromagnetic fields and intense X-rays could disrupt the test process or cause standard heating elements to deteriorate. The foregoing describes an approach to achieving heating and cooling of a platform using a fluid media such as air, gas or liquids without the need for heating elements within the platform. However, in one embodiment, an optional heater can be used within the platform.

In the embodiments described thus far, a heater can be added to the platform above or below the thermal plate 128.

Figure 10:
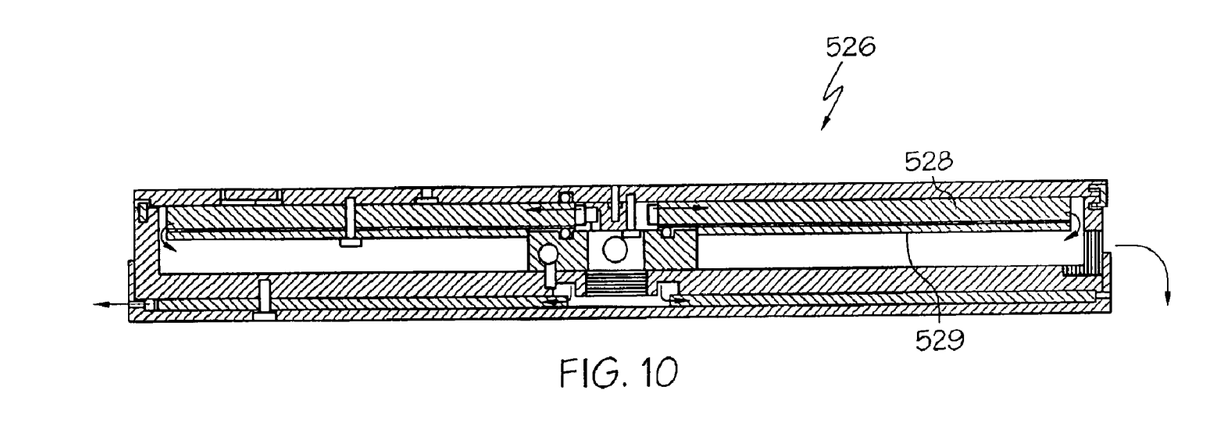
FIG. 10 contains a schematic cross-sectional diagram of another embodiment of the thermal platform of the invention in which a heater is attached below the porous thermal plate.

FIG. 10 contains a schematic cross-sectional diagram of another embodiment of the thermal platform 526 of the invention in which a heater 529 is attached below the porous thermal plate 528. In one embodiment, the heater 529 is a Mica or foil type heater. The heater 529 is used to provide additional heating of the platform 526 where required. The heater 529 is added to buffer the final temperature or in cases where the temperature set point of the air is in excess of the ability of the air supply line to carry the pressure to operate the system at temperature.

Figure 11:
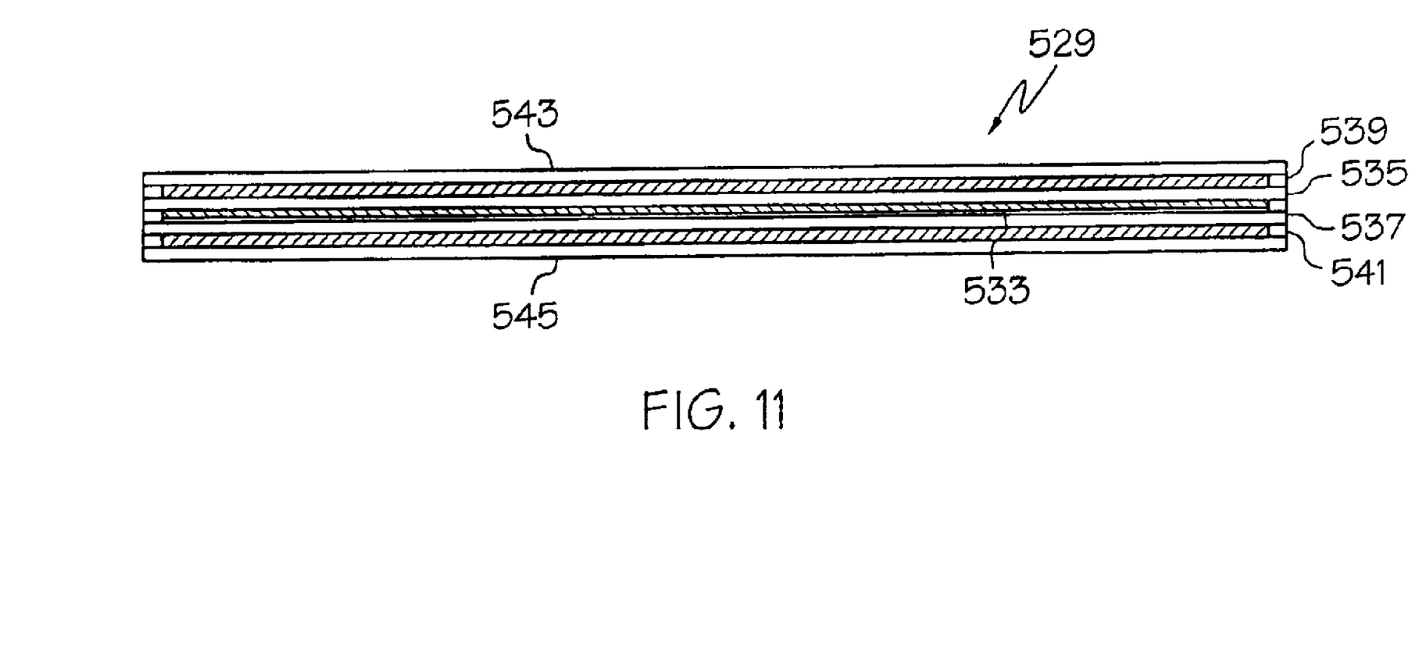
FIG. 11 contains a schematic cross-sectional diagram one embodiment of the heater included in the thermal platform of FIG. 10.

The heater 529 is of a multi-layered configuration. FIG. 11 contains a schematic cross-sectional diagram of one embodiment of the heater 529 included in the thermal platform 526 of FIG. 10. The multi-layered construction provides high electrical and noise isolation. Within the heater 529, the conductive heater element 533 is surrounded by layers 535 and 537 of Mica or Kapton insulation material. These layers are covered with a metal shield layer 539 and 541. These layers are then covered with Mica or Kapton layers 543 and 545.

The metal shield layers 539 and 541 are tied to ground to minimize radiated noise from the heater foil or element. The heater 529 is adhered, attached or fastened to the thermal plate 528. Alternatively, it can be held in place by compression from the thermal plate 528. The heater 529 provides the ability to boost the temperature of the thermal plate 528. The heater 529 can have elements or foil which allow for tuning of the thermal gradient.

While this invention has been particularly shown and described with references to preferred embodiments thereof, it will be understood by those skilled in the art that various changes in form and details may be made therein without departing from the spirit and scope of the invention as defined by the following claims.

What is claimed is:

1. A temperature-controlled system for supporting a workpiece comprising:
    a top surface assembly on which the workpiece can be mounted;
    a thermal plate in thermal communication with the top surface assembly, the thermal plate being formed of a porous thermally conductive material;
    a fluid inlet for allowing a temperature-controlled fluid to enter the thermal plate and propagate through the porous material of the thermal plate;
    a layer of channels at a surface of the thermal plate for facilitating the flow of the fluid through the thermal plate; and
    a temperature controller for controlling temperature of the fluid propagating through the thermal plate to control the temperature of the workpiece.

2. The system of claim 1, wherein the workpiece is a semiconductor wafer.

3. The system of claim 1, wherein the workpiece is a packaged integrated circuit.

4. The system of claim 1, wherein the fluid is air.

5. The system of claim 1, wherein the thermal platform is contained within a test system for testing the workpiece.

6. The system of claim 5, wherein at least a portion of the temperature controller is externally connected to the test system, the temperature controller comprising a fluid source for providing the fluid to the test system.

7. The system of claim 6, wherein the temperature controller comprises a heater inside the test system for heating the fluid.

8. The system of claim 1, wherein the test system is a wafer prober.

9. The system of claim 1, wherein the test system is a packaged device handler.

10. The system of claim 1, wherein the porous thermally conductive material comprises sintered metal.

11. The system of claim 1, wherein the porous thermally conductive material comprises reticulated foam.

12. The system of claim 1, wherein the porous thermally conductive material comprises copper.

13. The system of claim 1, wherein the porous thermally conductive material comprises carbon foam.

14. The system of claim 1, wherein the porous thermally conductive material comprises graphite foam.

15. The system of claim 1, wherein the channels are formed in a surface of the thermal plate.

16. The system of claim 1, wherein the channels are formed in a convector plate adjacent to the thermal plate.

17. An apparatus for testing an integrated circuit comprising:

a test system including a temperature-controlled platform on which the integrated circuit is supported and which is in thermal communication with the integrated circuit;

a temperature control coupled to the test system, the temperature control comprising:

a fluid source for providing a temperature control fluid to the temperature-controlled platform in the test system in thermal communication with the integrated circuit;

a controller for controlling the temperature of the fluid to control the temperature of the integrated circuit; and a fluid heater for heating the fluid, the fluid heater being located within the test system, the fluid heater being located external to the temperature-controlled platform between the fluid source and the temperature-controlled platform to heat the fluid before it enters the temperature-controlled platform.

18. The apparatus of claim 17, wherein the fluid is air.

19. The apparatus of claim 17, wherein the test system is a wafer prober.

20. The apparatus of claim 17, wherein the test system is a packaged integrated circuit device handler.

21. The apparatus of claim 17, wherein the integrated circuit is part of an integrated circuit wafer.

22. The apparatus of claim 17, wherein the integrated circuit is packaged.

* * * * *